(12) United States Patent
Werking

(10) Patent No.: US 10,587,234 B2
(45) Date of Patent: Mar. 10, 2020

(54) NON-INVERTING DIFFERENTIAL AMPLIFIER WITH CONFIGURABLE COMMON-MODE OUTPUT SIGNAL AND REDUCED COMMON-MODE GAIN

(71) Applicant: Honeywell International Inc., Morris Plains, NJ (US)

(72) Inventor: Paul M Werking, Rockford, MN (US)

(73) Assignee: Honeywell International Inc., Morris Plains, NJ (US)

( * ) Notice: Subject to any disclaimer, the term of this patent is extended or adjusted under 35 U.S.C. 154(b) by 167 days.

(21) Appl. No.: 15/648,265

(22) Filed: Jul. 12, 2017

(65) Prior Publication Data

US 2019/0020321 A1    Jan. 17, 2019

(51) Int. Cl.
*H03F 3/45*    (2006.01)

(52) U.S. Cl.
CPC ..... *H03F 3/45488* (2013.01); *H03F 3/45932* (2013.01)

(58) Field of Classification Search
CPC .................................................. H03F 3/45
USPC .................................. 330/85, 69, 258, 260
See application file for complete search history.

(56) References Cited

U.S. PATENT DOCUMENTS

| | | | |
|---|---|---|---|
| 6,924,696 B2 | 8/2005 | Wentink | |
| 7,078,965 B2 * | 7/2006 | Laletin | H03F 1/34 330/124 R |
| 7,952,428 B2 * | 5/2011 | Golden | H03F 1/26 330/124 R |
| 8,111,100 B1 * | 2/2012 | Pease | H03F 3/45475 330/260 |
| 8,138,830 B2 * | 3/2012 | Bugyik | H03F 3/45475 330/301 |
| 8,829,991 B2 * | 9/2014 | Jordan | H03F 3/45959 330/69 |
| 9,294,048 B2 * | 3/2016 | Van Helleputte | H03F 3/68 |

(Continued)

FOREIGN PATENT DOCUMENTS

| | | |
|---|---|---|
| WO | 2001035526 A2 | 5/2001 |
| WO | 2009035665 A1 | 3/2009 |

OTHER PUBLICATIONS

Intellectual Property Office of U.K., "Combined Search and Examination Report from GB Application No. GB1804367.9 dated Aug. 23, 2018", "from Foreign Counterpart of U.S. Appl. No. 15/648,265", filed Aug. 23, 2018, p. 1-7, Published in: UK.

*Primary Examiner* — Henry Choe
(74) *Attorney, Agent, or Firm* — Fogg & Powers LLC

(57) ABSTRACT

An embodiment of an amplifier circuit includes first, second, and third amplifiers. The first and second amplifiers are configured to amplify a differential input signal with a non-inverting gain. And the third amplifier, which can be a transconductance amplifier, is configured to cause the first and second amplifiers to amplify a common-mode input signal with a gain that is less than unity. The third amplifier can also be configured to cause the first and second amplifiers to generate a common-mode output voltage that is substantially independent of the common-mode input voltage. Consequently, in addition to presenting a high input impedance and a low noise factor, such an amplifier circuit has a configurable common-mode output voltage and has a lower common-mode gain (e.g., less than unity, approaching zero) than other non-inverting differential amplifiers.

23 Claims, 10 Drawing Sheets

(56) References Cited

U.S. PATENT DOCUMENTS

2013/0257536 A1\* 10/2013 Sharma .............. H03F 3/45475
　　　　　　　　　　　　　　　　　　　　　　　330/259

\* cited by examiner

US 10,587,234 B2

NON-INVERTING DIFFERENTIAL AMPLIFIER WITH CONFIGURABLE COMMON-MODE OUTPUT SIGNAL AND REDUCED COMMON-MODE GAIN

STATEMENT REGARDING FEDERALLY SPONSORED RESEARCH OR DEVELOPMENT

This invention was made with Government support under N00014-14-9-0001 awarded by the Office of Naval Research. The Government has certain rights in the invention.

SUMMARY

Unless otherwise noted, an "ideal" operational amplifier has infinite differential and common-mode input impedance, infinite open-loop gain, and zero (single-ended or differential) output impedance. Also unless otherwise noted, an "ideal" operational transconductance amplifier has infinite differential and common-mode input impedance, infinite open-loop gain, and infinite (single-ended, differential, or dual-ended) output impedance.

FIG. 1 is a schematic diagram of an inverting fully differential amplifier circuit 10, which includes a differential amplifier 12 having two input nodes 14 and 16, which form a single differential input port, and having two output nodes 18 and 20, which form a single differential output port, and which also includes gain-and-frequency-response-control elements, here resistors R1-R4.

The input nodes 14 and 16 are each configured to receive a respective component $V_{IN1}$ and $V_{IN2}$ of a differential input voltage $V_{IN-DM}=V_{IN1}-V_{IN2}$ and of a common-mode input voltage $V_{IN-CM}=(V_{IN1}+V_{IN2})/2$, and the output nodes 16 and 18 are each configured to provide a respective component $V_{OUT1}$ and $V_{OUT2}$ of a differential output voltage $V_{OUT-DM}=V_{OUT1}-V_{OUT2}$ and of a common-mode output voltage $V_{OUT-CM}=(V_{OUT1}+V_{OUT2})/2$.

The four resistors control the gain of the amplifier circuit 10 and, for purposes of example, it is assumed that, ideally, R1=R2 and R3=R4.

The ideal differential voltage gain $A_{V-DM}$ of the amplifier circuit 10 is given by the following equation:

$$A_{V-DM}=V_{OUT-DM}/V_{IN-DM}=-R3/R1 \quad (1)$$

And the ideal common-mode gain $A_{V-CM}$ of the amplifier circuit 10 is given by the following equation:

$$A_{V-CM}=V_{OUT-CM}/V_{CM}=0 \quad (2)$$

where $V_{CM}$ is a reference voltage (typically constant) that ideally sets $V_{OUT-CM}$ to a fixed value regardless of the value of $V_{IN-CM}$ as described below in conjunction with FIG. 2. That is, if the amplifier 12 is an ideal amplifier, $V_{OUT-CM}$ depends only on $V_{CM}$, and is independent of $V_{IN-CM}$. For example, some applications call for $V_{OUT-CM}=(V_{cc}+-V_{cc})/2$, where $V_{cc}$ is the higher supply voltage for the amplifier circuit 10 and $-V_{cc}$ is the lower supply voltage for the amplifier circuit. Further to this example, if $V_{cc}=+12$ V and $-V_{cc}=-12$ V, then some applications call for $V_{OUT-CM}=(12+(-12))/2=0$ V in an ideal amplifier circuit. Consequently, in this example, a circuit designer can choose the value of $V_{CM}$ that results in $V_{OUT-CM}=0$ regardless of the value of $V_{IN-CM}=(V_{IN1}+V_{IN2})/2$.

FIG. 2 is a schematic diagram of a functionally equivalent circuit 30 of the differential amplifier circuit 10 of FIG. 1.

In the equivalent circuit 30, the differential amplifier 12 is decomposed into three amplifiers (e.g., operational amplifiers) 32, 34, and 36 each having a respective differential input and a single-ended output.

Furthermore, the equivalent circuit 30 includes two additional resistors R5 and R6; for purposes of example, it is assumed that ideally R5=R6.

In operation, the resistors R5 and R6 ideally generate, at a node V3, $V_{OUT-CM}=(V_{OUT1}+V_{OUT2})/2=V_{CM}$. That is, ideally, $V_{OUT-CM}=V_{CM}$ regardless of the value of $V_{IN-CM}=(V_{IN1}+V_{IN2})/2$.

Because the amplifier 34 receives, at its non-inverting and inverting nodes, $V_{CM}$ and $V_{OUT-CM}$, respectively, because an output node of the amplifier 34 is respectively coupled to the inverting and the non-inverting input nodes of the differential amplifiers 32 and 36, and because $V_{CM}$ is a fixed voltage (e.g., a bandgap reference voltage generated by a bandgap voltage generator), the amplifier 34 ideally maintains $V_{OUT-CM}=V_{IN-CM}$ regardless of the value of $V_{IN-CM}$. This also results in the ideal common-mode gain of the amplifier circuit 10 being zero, because, ideally, $V_{OUT-CM}$ does not change if $V_{IN-CM}$ changes.

For example, as described above, in some applications, the differential amplifier circuit 10 is configured to set $V_{CM}=V_{OUT-CM}=(+V_{cc}+-V_{cc})/2$. That is, in some applications, the differential amplifier circuit 10 is configured to set $V_{CM}$ and $V_{OUT-CM}$ half way between the positive and negative power-supply-voltage "rails" $+V_{cc}$ and $-V_{cc}$.

FIG. 3 is a more-detailed schematic diagram of the differential amplifier circuit 10 of FIG. 1. The differential amplifier circuit 10, which is configured to operate as described above in conjunction with FIG. 2, includes the resistors R5 and R6 of FIG. 2, and includes a second pair of inverting and non-inverting input nodes 40 and 42, which respectively correspond to the inverting and non-inverting input nodes of the amplifier 34 of the equivalent circuit 30 of FIG. 2.

Referring to FIGS. 1-3, the ideal differential noise gain $A_{N-DM}$ of the differential amplifier circuit 10 is given by the following equation:

$$A_{N-DM}=(R3+R1)/R1=1+(R3/R1) \quad (3)$$

and ideally the common-mode noise gain $A_{N-CM}=A_{N-DM}$.

For the amplifier circuit 10, the ideal equality $A_{N-CM}=A_{N-DM}$ can be seen by inspection of the equivalent circuit 30 of FIG. 2 because the node V4 forms a virtual ground.

Furthermore this equality imposes, on the noise factor F of the amplifier circuit 10, the following limit $F_{min}$ for which it is assumed that the components (e.g., operational amplifiers, resistors) of the amplifier circuit are noiseless:

$$F_{min}=1+(R1/R3)=1+|1/A_{V-DM}| \quad (4)$$

where the noise factor F is defined as the ratio of the total available output noise power over the available output noise power due to the input-signal source only.

And the noise figure NF of an amplifier circuit is equal to $10 \cdot \log_{10} F$.

Therefore, $F_{min}$ is significant (i.e., $F_{min}=2$, $NF_{min}=3$ dB) at unity gain, and can be even worse at lower gains.

And still referring to FIGS. 1-3, the differential input impedance of the amplifier circuit 10 ideally equals R1+R2=2R1, where R1=R2.

FIG. 4 is a schematic diagram of a non-inverting fully differential amplifier circuit 50, which includes a first differential amplifier 52, a second differential amplifier 54, and gain-and-frequency-response-control elements, here resistors R1-R4.

The first differential amplifier 52 includes non-inverting and inverting input nodes 56 and 58 and an output node 60, and the second differential amplifier 54 includes non-inverting and inverting input nodes 62 and 64 and an output node 66.

The two input nodes 56 and 62 of the amplifiers 52 and 54 form a single differential input port, and the two output nodes 60 and 66 of the amplifiers form a single differential output port.

Furthermore, the input nodes 56 and 62 are each configured to receive a respective component $V_{IN1}$ and $V_{IN2}$ of a differential input voltage $V_{IN-DM}=V_{IN1}-V_{IN2}$ and of a common-mode input voltage $V_{IN-CM}=(V_{IN1}+V_{IN2})/2$, and the output nodes 60 and 66 are each configured to provide a respective component $V_{OUT1}$ and $V_{OUT2}$ of a differential output voltage $V_{OUT-DM}=V_{OUT1}-V_{OUT2}$ and of a common-mode output voltage $V_{OUT-CM}=(V_{OUT1}+V_{OUT2})/2$.

The four resistors control the gain and the bandwidth of the amplifier circuit 50 and, for purposes of example, it is assumed that R1=R2 and R3=R4.

The ideal differential voltage gain $A_{V-DM}$ of the amplifier circuit 50 is given by the following equation:

$$A_{V-DM}=V_{OUT-DM}/V_{IN-DM}=1+(R3/R1) \quad (5)$$

Assuming that the amplifiers 52 and 54 are ideal operational amplifiers, and, therefore, have infinite open-loop gain, $V_{IN-CM}=V_{OUT-CM}=V3$. In more detail, a voltage $V_1$ at the input node 58 equals $V_{IN1}$ at the input node 56, and a voltage $V_2$ at the input node 64 equals $V_{IN2}$ at the input node 62. Furthermore, because R1=R2, it follows that $V_{IN-CM}=V_3$ (the voltage at the node V3), and because R3=R4, it also follows that $V_{OUT-CM}=V_3$.

Therefore, assuming that the amplifiers 52 and 54 are ideal operational amplifiers, the ideal common-mode gain $A_{V-CM}$ of the amplifier circuit 50 is given by the following equation:

$$A_{V-CM}=V_{OUT-CM}/V_{IN-CM}=V3/V3=1 \quad (6)$$

And the ideal differential noise gain $A_{N-DM}$ of the differential amplifier circuit 50 is given by the following equation:

$$A_{N-DM}=(R3+R1)/R1=1+(R3/R1) \quad (7)$$

and the ideal common-mode noise gain $A_{N-CM}=A_{N-DM}$.

Furthermore, because the amplifier circuit 50 is a non-inverting fully differential amplifier circuit, the ideal differential noise gain $A_{N-DM}$ equals the ideal differential voltage gain $A_{V-DM}$ as one can deduce by comparing equations (6) and (8).

Consequently, the noise factor F and the noise figure NF of the amplifier circuit 50 ideally have the following limits for which it is assumed that the components (e.g., operational amplifiers, resistors) of the amplifier circuit are noiseless:

$$F_{min}=1 \quad (8)$$

$$NF_{min}=0 \text{ dB} \quad (9)$$

Unlike for the amplifier circuit 10 of FIGS. 1 and 3, the limits $F_{min}$ and $NF_{min}$ for the amplifier circuit 50 are independent of the differential voltage gain $A_{V-DM}$ of the amplifier circuit 50.

Therefore, at lower gains, the noise factor F of the non-inverting differential amplifier circuit 50 is significantly less than the noise factor F of the inverting differential amplifier circuit 10 of FIGS. 1 and 3. For example, at unity gain, the noise-factor limit ($F_{min}=1$; $NF_{min}=0$ dB) of the non-inverting differential amplifier circuit 50 is half of the noise-factor limit ($F_{min}=2$; $NF_{min}=3$ dB) of the inverting differential amplifier circuit 10.

Furthermore, the differential input impedance of the non-inverting differential amplifier circuit 50 is, ideally, infinite; but even if the non-inverting differential amplifier circuit 50 is not ideal, its differential input impedance is still relatively high (e.g., >10 megaohms (MΩ)), and, therefore, is still significantly higher than the 2R1 differential input impedance of the inverting differential amplifier circuit 10 of FIGS. 1 and 3.

Consequently, referring to FIGS. 1 and 3-4, the non-inverting differential amplifier circuit 50 has a higher input impedance and has a lower noise factor F at lower closed-loop gains (e.g., at unity gain) than does the inverting differential amplifier circuit 10.

But the non-inverting differential amplifier circuit 50 has a higher common-mode gain than the inverting differential amplifier circuit 10 of FIGS. 1 and 3 (ideal common-mode gain of 1 vs. ideal common-mode gain of 0), and has a configuration that causes $V_{OUT-CM}=V_{IN-CM}$ such that $V_{OUT-CM}$ depends on $V_{IN-CM}$ and, therefore, cannot be set to a fixed value.

Unfortunately, the higher common-mode gain, and $V_{OUT-CM}$ depending on $V_{IN-CM}$, can render the non-inverting differential amplifier circuit 50 unsuitable for some applications, even applications in which the higher input impedance and lower noise factor of the amplifier circuit 50 are desirable.

FIG. 5 is a schematic diagram of a non-inverting differential amplifier circuit 70, which, except for a common-mode current source 72, is similar to the non-inverting amplifier circuit 50 of FIG. 4; therefore, like numbers label components common to the amplifier circuits of FIGS. 4 and 5.

As described below, a circuit designer can configure the common-mode current source 72 to set $V_{OUT-CM} \neq V_{IN-CM}$.

The current source 72 sinks a constant (i.e., DC) current $2 \cdot I_1$ from the node V3.

If R1=R2 and the amplifiers 52 and 54 are ideal operational amplifiers, then the current $2 \cdot I_1$ splits equally between R1 and R2 (i.e., the current source 72 sinks a current $I_1$ through R1 and a current $I_1$ through R2) such that the common-mode (or average) voltage $V_3$ at the node V3 is given by the following equation:

$$V_3=V_{IN-CM}-I_1R_1 \quad (10)$$

where $V_{IN-CM}=(V_{IN1}+V_{IN2})/2$ is the common-mode input voltage as described above.

Furthermore, if the amplifiers 52 and 54 are ideal operational amplifiers, a respective current $I_1$ also flows through each of the resistors R3 and R4. If R3=R4, then the output common-mode voltage $V_{OUT\_CM}$ is given by the following equation:

$$V_{OUT-CM}=V_{IN-CM}+I_1R_3 \quad (11)$$

such that $V_{OUT-CM} \neq V_{IN-CM}$.

But although by configuring the current source 72 to generate $2-I_1 \neq 0$ a circuit designer can configure the amplifier circuit 70 to generate $V_{OUT-CM} \neq V_{IN-CM}$, the amplifier circuit, even if ideal, still has a common-mode voltage gain of unity (i.e., $V_{OUT-CM}$ and $V_{IN-CM}$ differ only by a constant $I_1R_3$), and still cannot be configured to set $V_{OUT-CM}$ to a value (e.g., $(V_{cc}+-V_{cc})/2$) that is independent of $V_{IN-CM}$.

Still referring to FIG. 5, an amplifier circuit similar to the amplifier circuit 70 is further described in U.S. Pat. No. 6,924,696 to Wentink, which patent is incorporated by reference herein.

Consequently, described below is at least one embodiment of a non-inverting differential amplifier circuit that not only has a higher input impedance and a lower noise factor than an inverting differential amplifier circuit, but that also has a lower-common mode gain than a conventional non-inverting differential amplifier circuit, and that can be configured to generate a common-mode output voltage that is independent of a common-mode input voltage.

For example, an embodiment of such an amplifier circuit includes first, second, and third amplifiers. The first and second amplifiers are configured to amplify a differential input signal with a non-inverting (greater than zero) gain. And the third amplifier is configured to cause the first and second amplifiers to amplify a common-mode input signal with a gain that is less than unity. The third amplifier can also be configured to cause the first and second amplifiers to generate a common-mode output voltage that is substantially independent of the common-mode input voltage.

And another embodiment of the amplifier circuit includes a first amplifier, a second amplifier, and a transconductance amplifier. The first amplifier has a noninverting input node configured to receive a first component of a differential input signal, has an inverting input node, and has an output node configured to provide a first component of a differential output signal. The second amplifier has a noninverting input node configured to receive a second component of the differential input signal, has an inverting input node, and has an output node configured to provide a second component of the differential output signal. And the transconductance amplifier has an inverting input node configured to receive a reference signal, has a noninverting input node coupled to the output nodes of the first and second amplifiers, and has a first output node coupled to the inverting input node of at least one of the first amplifier and the second amplifier.

DETAILED DESCRIPTION

Each non-zero value, quantity, or attribute herein preceded by "substantially," "approximately," "about," a form or derivative thereof, or a similar term, encompasses a range that includes the value, quantity, or attribute±20% of the value, quantity, or attribute, or a range that includes +20% of a maximum difference from the value, quantity, or attribute. For example, "two planes are substantially parallel to one another" encompasses an angle $-18°<\alpha<+18°$ between the two planes (|90°| is the maximum angular difference between the two planes, ±20% of |90°| is ±18°, and the two planes are parallel to one another when $\alpha=00$). And for a zero-value, the encompassed range is ±1 of the same units unless otherwise stated.

Figure 6:
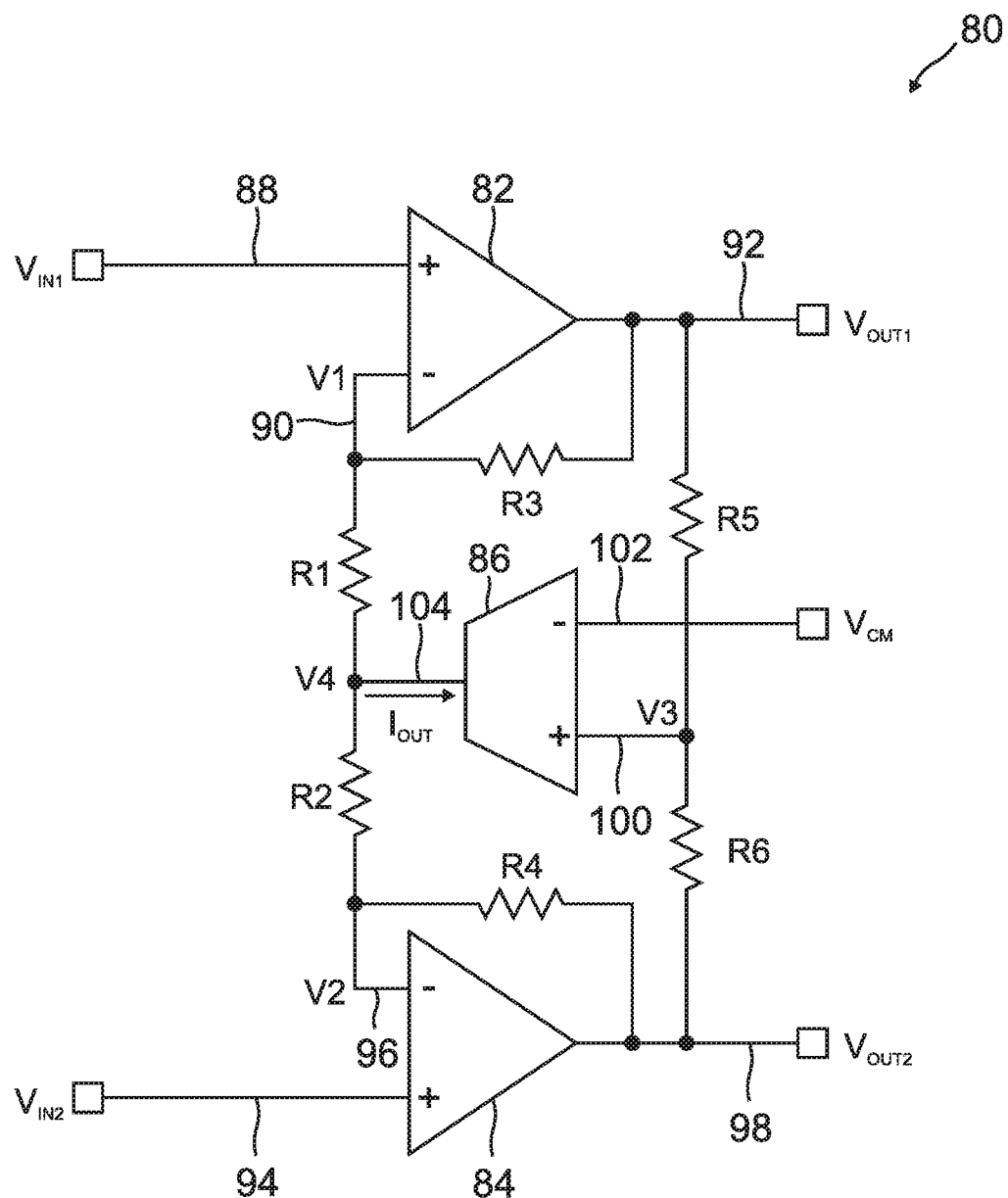
FIG. 6 is a schematic diagram of a non-inverting fully differential amplifier circuit with an approximately zero common-mode gain and with a settable common-mode output voltage that is approximately independent from the common-mode input voltage, according to an embodiment.

FIG. 6 is a schematic diagram of a non-inverting fully differential amplifier circuit 80, according to an embodiment. As described below, the amplifier circuit 80 has, ideally, infinite differential input impedance, a noise factor F=1 for all values of differential gain, a common-mode gain $A_{V-CM}=0$, and a configurable common-mode output voltage $V_{OUT-CM}$ that is fully independent of the common-mode input voltage $V_{IN-CM}$.

The amplifier circuit 80 includes a first differential amplifier 82, a second differential amplifier 84, a third differential amplifier 86, and gain-and-frequency-response-control elements, here resistors R1-R6. The first and second amplifiers 82 and 84 can be, for example, respective operational amplifiers or respective operational transconductance amplifiers, and the third amplifier 86 can be, for example, an operational transconductance amplifier. As described below, using a transconductance amplifier for the third amplifier 86 ideally imparts to the amplifier circuit 80 a zero common-mode gain and a configurable common-mode output voltage that is independent of the common-mode input voltage. Therefore, for purposes of example, it is assumed hereinafter that the third amplifier 86 is a transconductance amplifier.

The first differential amplifier 82 includes non-inverting and inverting input nodes 88 and 90 and an output node 92, the second differential amplifier 84 includes non-inverting and inverting input nodes 94 and 96 and an output node 98, and the third differential amplifier 86 includes non-inverting and inverting input nodes 100 and 102 and an output node 104.

The two non-inverting input nodes 88 and 94 of the amplifiers 82 and 84 form a single differential input port of the amplifier circuit 80, and the two output nodes 92 and 98 of these amplifiers form a single differential output port of the amplifier circuit.

Furthermore, the non-inverting input nodes 88 and 94 are each configured to receive a respective component $V_{IN1}$ and $V_{IN2}$ of a differential input voltage $V_{IN-DM}=V_{IN1}-V_{IN2}$ and of a common-mode input voltage $V_{IN-CM}=(V_{IN1}+V_{IN2})/2$, and the output nodes 92 and 98 are each configured to provide a respective component $V_{OUT1}$ and $V_{OUT2}$ of a differential output voltage $V_{OUT-DM}=V_{OUT1}-V_{OUT2}$ and of a common-mode output voltage $V_{OUT-CM}=(V_{OUT1}+V_{OUT2})/2$.

The four resistors R1-R4 control the gain and the bandwidth of the amplifier circuit 80 and, for purposes of example, it is assumed that, ideally, R1=R2 and R3=R4.

Furthermore, it is assumed that, ideally, R5=R6 such that the voltage $V_3$ at the node V3 is given by the equation $V_3 = V_{OUT-CM} = (V_{OUT1} + V_{OUT2})/2$.

The ideal differential voltage gain $A_{V-DM}$ of the amplifier circuit 80 is given by the following equation:

$$A_{V-DM} = V_{OUT-DM}/V_{IN-DM} = 1 + (R3/R1) \quad (12)$$

Furthermore, the ideal differential noise gain $A_{N-DM}$ of the non-inverting differential amplifier circuit 80 is given by the following equation:

$$A_{N-DM} = (R3+R1)/R1 = 1 + (R3/R1) \quad (13)$$

because the output impedance of the transconductance amplifier 86 is much greater (e.g., at least approximately ten times greater, ideally infinite) than R1 and R2 as described below.

Moreover, because the amplifier circuit 80 is a non-inverting differential amplifier circuit, the ideal differential noise gain $A_{N-DM}$ equals the ideal differential voltage gain $A_{V-DM}$ as one can deduce by comparing equations (12) and (13).

And the common-mode noise gain $A_{N-CM}$ of the amplifier circuit 80 ideally equals the differential-voltage gain $A_{V-DM}$.

Consequently, the noise factor F and the noise figure NF of the amplifier circuit 80 ideally have the following limits for which it is assumed that the components (e.g., operational amplifiers, transconductance amplifiers, resistors) of the amplifier circuit are noiseless:

$$F_{min} = 1 \quad (14)$$

$$NF_{min} = 0 \text{ dB} \quad (15)$$

and, per equations (14) and (15), the limits $F_{min}$ and $NF_{min}$ for the amplifier circuit 80 are independent of the amplifier circuit's differential voltage gain $A_{V-DM}$.

Furthermore, the differential input resistance of the non-inverting differential amplifier circuit 80 is, ideally, infinite; but even if the non-inverting differential amplifier circuit 80 is not ideal, its differential input resistance is still relatively high (e.g., greater than approximately 10 mega-ohms (MΩ)).

Still referring to FIG. 6, the transconductance amplifier 86 ideally has infinite input impedance at its input nodes 100 and 102, and, unlike an operational amplifier, ideally has infinite output impedance at its output node 104. Therefore, the transconductance amplifier 86 ideally generates an output current $I_{OUT}$ according to the following equation:

$$I_{OUT} = g_m(V_3 - V_{CM}) \quad (16)$$

where $g_m$, which is ideally infinite, is the transconductance gain in units of Amperes (A)/Volts (V).

So that $I_{OUT}$ is not too large for the transconductance amplifier 86 to generate, the transconductance amplifier generates $I_{OUT}$ so as to cause the voltage $V_3$ at the node V3 to approach, and approximately to equal, $V_{CM}$.

Therefore, because, ideally, $V_3 = V_{OUT-CM}$ as described above, the transconductance amplifier 86 is ideally configured to cause $V_3 = V_{OUT-CM} = V_{CM}$ such that the common-mode output voltage $V_{OUT-CM}$ has a fixed/configurable value (by fixing/configuring the value of $V_{CM}$) that is independent of the common-mode input voltage $V_{IN-CM} = (V_{IN1} - V_{IN2})/2$. For example, $V_{CM}$ can be a bandgap-reference voltage that is set to $(V_{cc} + -V_{cc})/2$, where $V_{cc}$ is the higher supply voltage to the amplifier circuit 80 and $-V_{cc}$ is the lower supply voltage to the amplifier circuit. That is, $V_{CM}$ can be set to be half way between the power-supply "rails" $V_{cc}$ and $-V_{cc}$ to allow for a maximum voltage amplitude (e.g., a maximum voltage swing) of the differential output voltage $V_{OUT-DM} = V_{OUT1} - V_{OUT2}$ without "clipping" of $V_{OUT-DM}$.

Therefore, assuming that the transconductance amplifier 86 is an ideal amplifier, because the transconductance amplifier causes the output common-mode voltage $V_{OUT-CM}$ to equal the reference voltage $V_{CM}$ regardless of the value of the common-mode input voltage $V_{IN-CM}$, the ideal common-mode gain $A_{V-CM}$ of the amplifier circuit 80 is given by the following equation:

$$A_{V-CM} = V_{OUT-CM}/V_{IN-CM} = 0 \quad (17)$$

Figure 4:
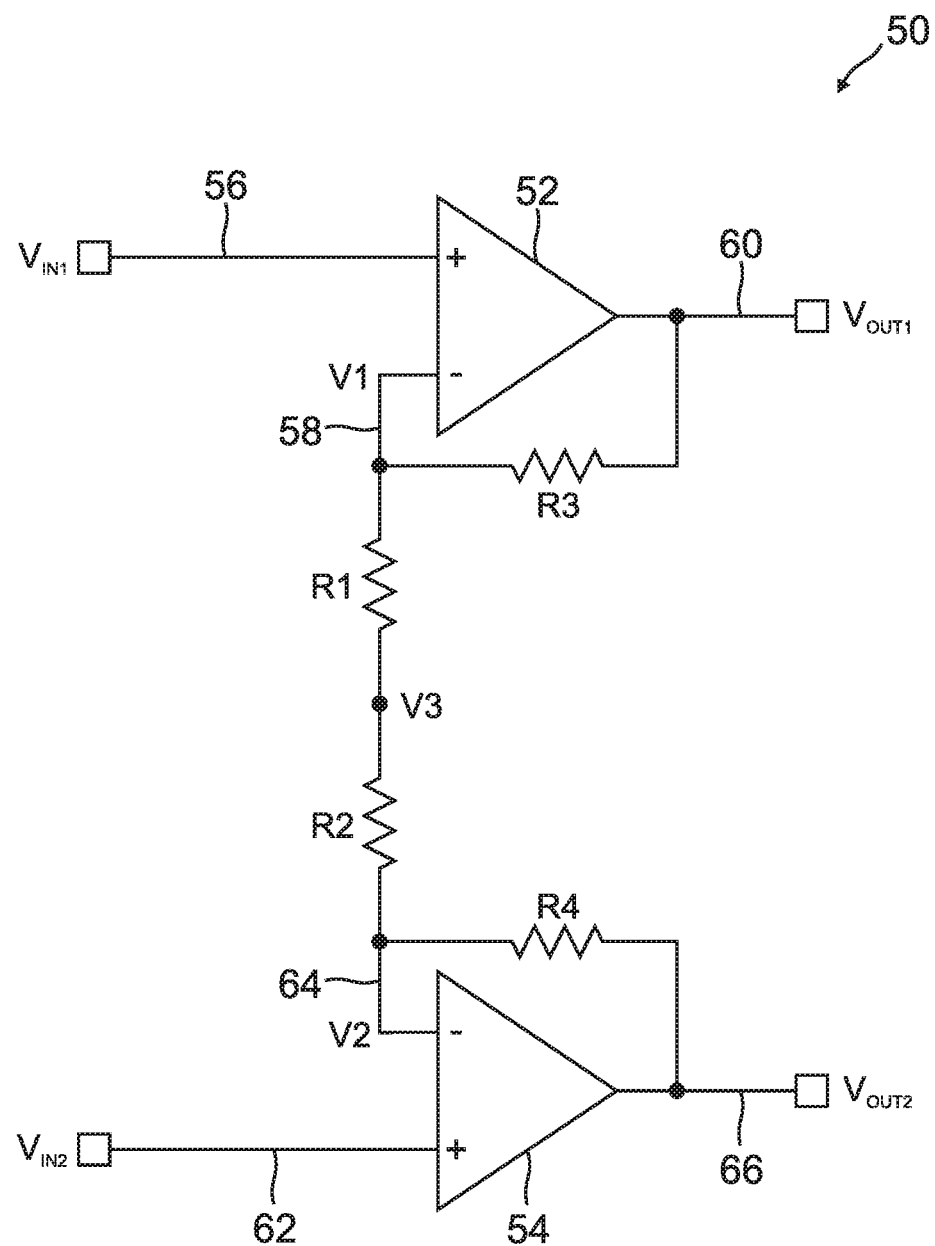
FIG. 4 is a schematic diagram of a non-inverting fully differential amplifier circuit with a non-zero common-mode gain and with common-mode output voltage that is dependent on the common-mode input voltage.
Figure 5:
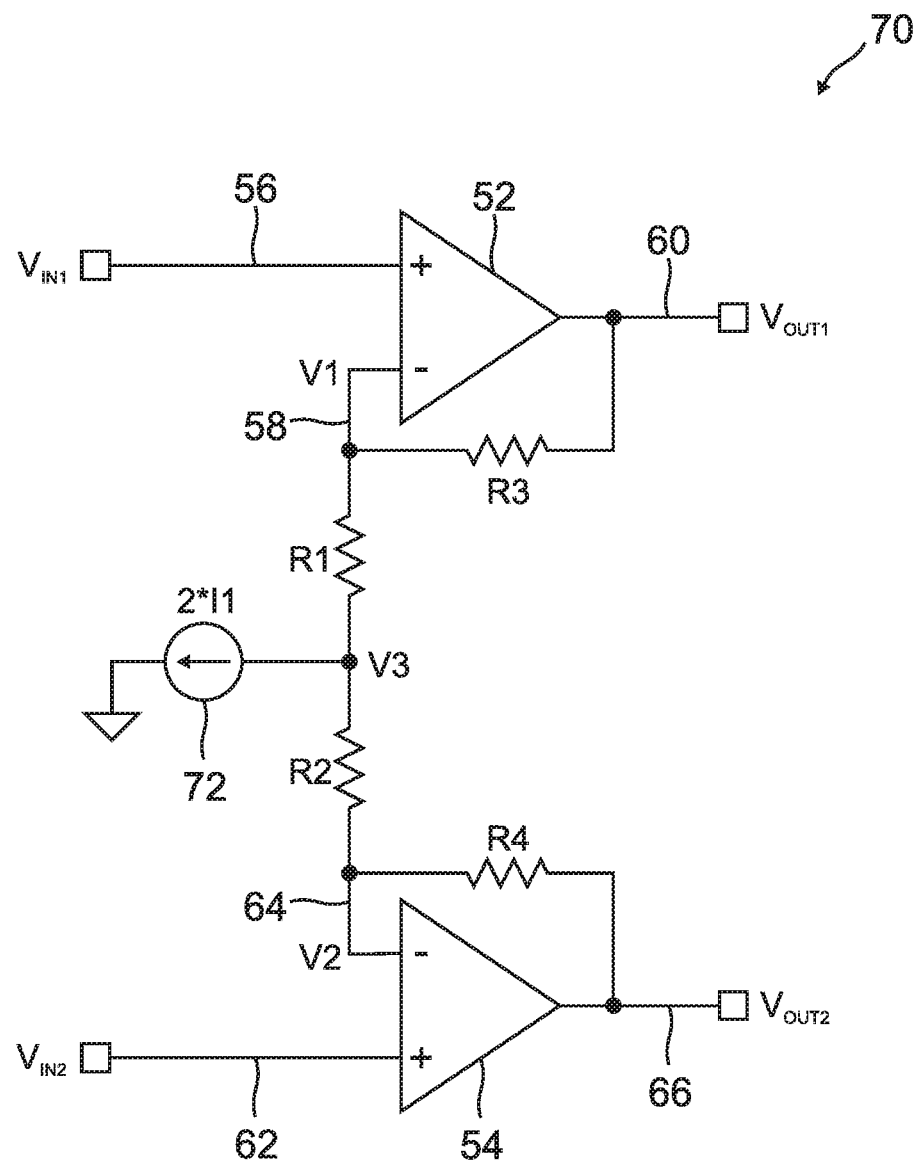
FIG. 5 is a schematic diagram of a non-inverting fully differential amplifier circuit with a non-zero common-mode gain and with a settable common-mode output voltage that is dependent on the common-mode input voltage.

And even if the transconductance amplifier 86 is not ideal, the common-mode gain $A_{V-CM}$ of the amplifier circuit 80 is still very low, and is still much lower (e.g., at least approximately ten times lower) than the unity common-mode gain of the non-inverting amplifier circuits 50 and 70 of FIGS. 4-5. For a non-ideal transconductance amplifier 86, $A_{V-CM}$ is the ratio of the closed-loop gain of the loop including the transconductance amplifier to the open-loop gain of the transconductance amplifier, and, therefore, is given by the following equation:

$$A_{V-CM} = (R3/R1)/g_m(R1/2) = 2R3/g_m R1^2 \quad (18)$$

for which it is assumed that R1=R2 and R3=R4.

For typical values of R1 and R3 (e.g., approximately 10 kilo-ohms (KΩ)-100 KΩ) and $g_m$ (e.g., approximately 1), the common-mode gain $A_{V-CM}$ of the amplifier circuit 80 is on the order of −80 dB to −100 dB, which, although not zero, is still much less than unity.

Still referring to FIG. 6, a circuit designer typically AC/frequency compensates the amplifier circuit 80 to prevent the amplifier circuit from having a severely underdamped response that can cause the amplifier circuit to "ring" and to oscillate.

One potential cause of such ringing and oscillation is an unstable common-mode response of the amplifier circuit 80. For common-mode signals, the amplifiers 82 and 84 are in parallel and can be modeled as a single amplifier, and the transconductance amplifier 86 can be modeled as forming a feedback loop including this combined amplifier. Because of the two equivalent amplifiers 82/84 and 86 in the common-mode loop, it is possible to get 360° of phase shift and a resulting ringing or oscillation, particularly if the same technology is used to build all of the amplifiers 82, 84, and 86, and the amplifiers all have approximately the same unity-gain bandwidth.

One technique for preventing such common-mode instability is to design, or otherwise configure, the transconductance amplifier 86 so that its unity-gain bandwidth is significantly different (e.g., approximately an order of magnitude less or approximately an order of magnitude more) from the unity-gain bandwidths of the amplifiers 82 and 84.

Alternately, passive components (e.g., resistors and capacitors) in the form of, e.g., feedback networks, can be used to compensate the amplifier circuit 80 in a conventional manner. For example, suitably sized capacitors can be put in parallel with the resistors R3 and R4.

Still referring to FIG. 6, operation of the non-inverting fully differential amplifier circuit 80 is described, according to an embodiment.

The amplifier circuit 80 receives a differential input signal $V_{IN-DM} = V_{IN1} - V_{IN2}$ across its input nodes 88 and 94, and amplifies $V_{IN-DM}$ to generate a differential output signal $V_{OUT-DM} = V_{OUT1} - V_{OUT2} \approx V_{IN-DM} \cdot A_{V-DM}$ per equation (13).

Furthermore, the transconductance amplifier 86 generates $I_{OUT}$ having a magnitude that causes the common-mode output voltage $V_{OUT-CM}$ to approximately equal $V_{CM}$, which may be provided from an external source, or which may be generated by circuitry (e.g., bandgap-reference circuitry) that forms part of the amplifier circuit 80. For example, one can set $V_{CM}$ ($V_{cc}+-V_{cc}$)/2.

Consequently, like the non-inverting amplifier circuits 50 and 70 of FIGS. 4-5, the non-inverting amplifier circuit 80 has high input impedance and a low noise factor F, which is substantially independent of the differential gain $A_{V-DM}$ of the amplifier circuit.

But better than the non-inverting amplifier circuits 50 and 70 of FIGS. 4-5, the non-inverting amplifier circuit 80 has a low common-mode gain (e.g., less than unity, and even less than approximately −10 dB) and is configured to set the common-mode output voltage $V_{OUT-CM}$ to a level that is substantially independent of the common-mode input voltage $V_{IN-CM}$.

Figure 1:
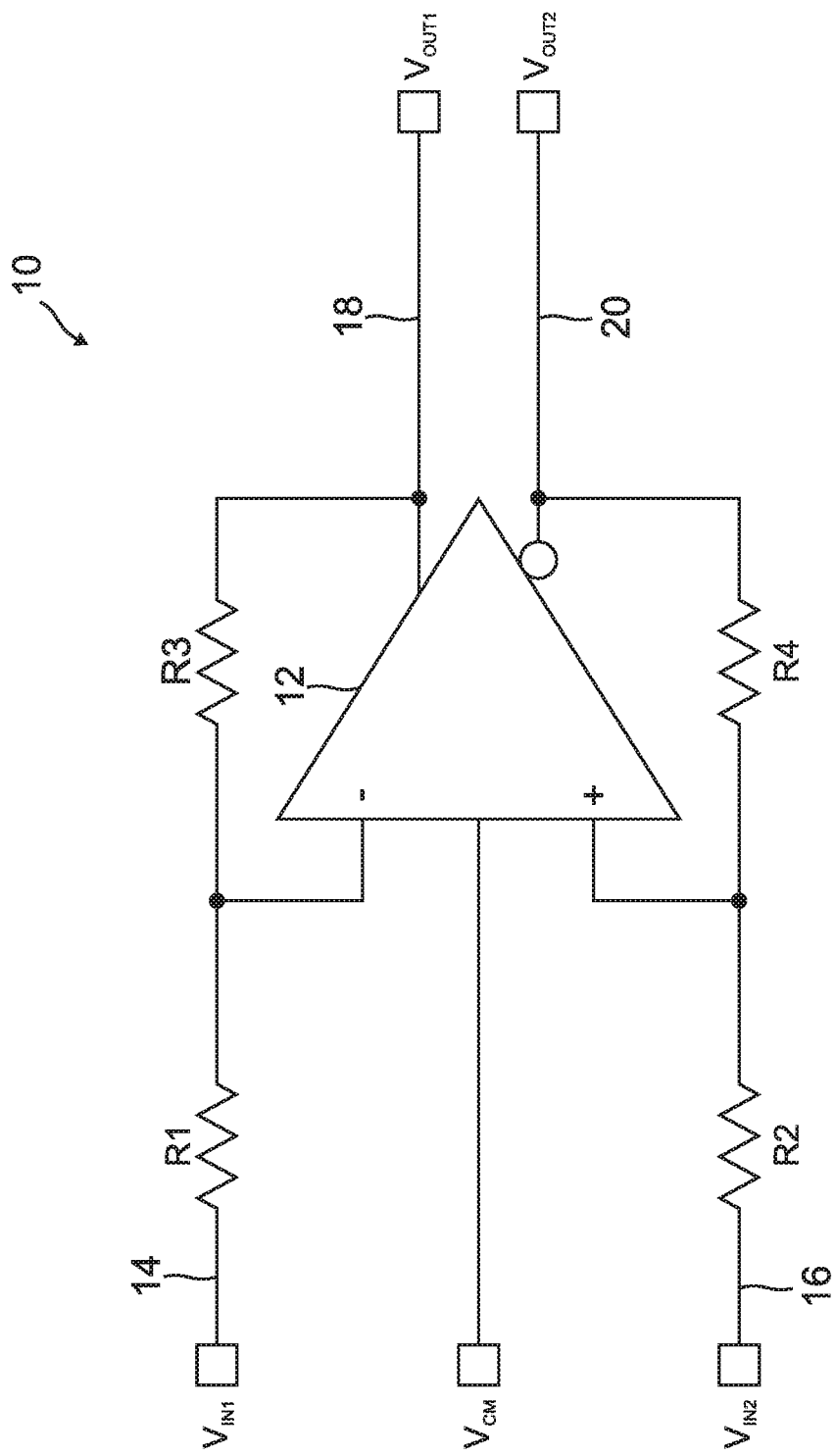
FIG. 1 is schematic diagram of an inverting fully differential amplifier circuit with a settable common-mode output voltage.
Figure 2:
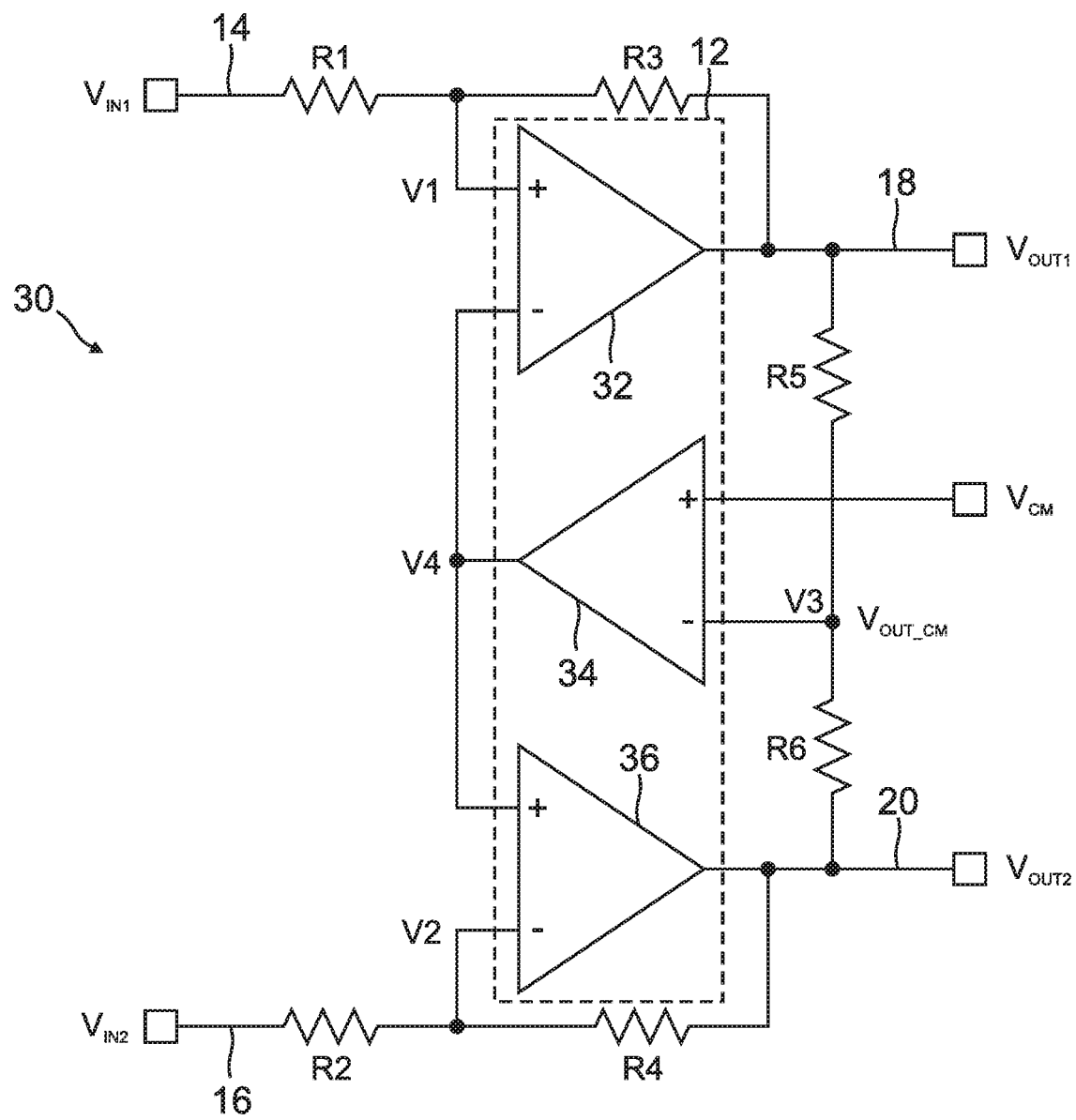
FIG. 2 is a schematic diagram of an equivalent circuit of the inverting fully differential amplifier circuit of FIG. 1.
Figure 3:
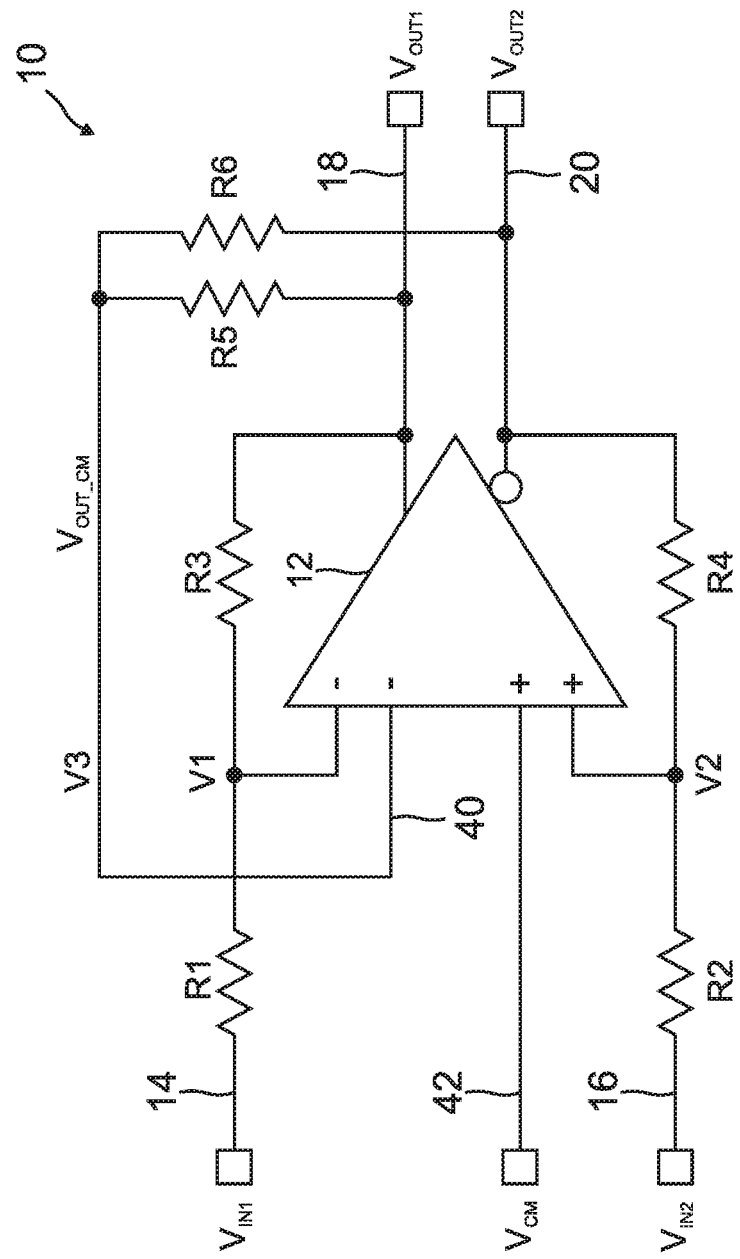
FIG. 3 is another schematic diagram of the inverting fully differential amplifier circuit of FIG. 1.

That is, the non-inverting differential amplifier circuit 80 combines the advantages of the inverting differential amplifier 10 of FIGS. 1 and 3 with the advantages of the non-inverting amplifiers 50 and 70 of FIGS. 4-5.

Still referring to FIG. 6, alternate embodiments of the non-inverting differential amplifier circuit 80 are contemplated. For example, as described above, either one or both of the amplifiers 82 and 84 can be an operational amplifier or a transconductance amplifier. Furthermore, the amplifier circuit 80 may omit one or more described components, or may include one or more components (e.g., one or more compensation capacitors) in addition to the described components.

Figure 7:
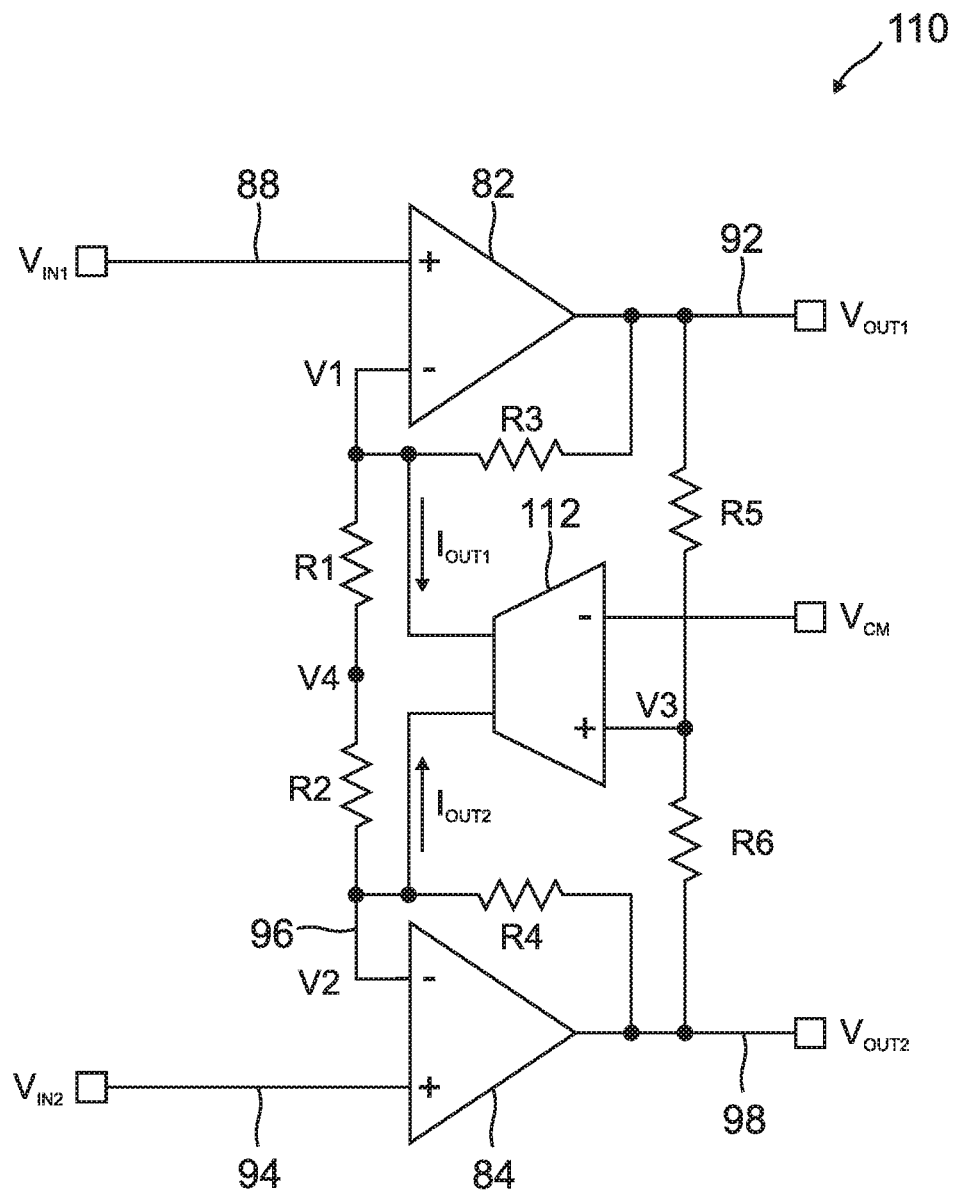
FIG. 7 is a schematic diagram of a non-inverting fully differential amplifier circuit with an approximately zero common-mode gain and with a settable common-mode output voltage that is approximately independent from the common-mode input voltage, according to another embodiment.

FIG. 7 is a schematic diagram of a non-inverting fully differential amplifier circuit 110, according to an embodiment.

The amplifier circuit 110 is similar to the amplifier circuit 80 of FIG. 6 except that the single-output transconductance amplifier 86 of FIG. 6 is replaced with a dual-output transconductance amplifier 112 such as described in U.S. Pat. No. 8,081,030 to Werking, which patent is incorporated by reference herein. Therefore, like numbers reference components common to the amplifier circuits 80 and 110 in FIGS. 6 and 7.

The amplifier circuit 110 may be particularly suitable for applications that call for the amplifier circuit to have a differential gain $A_{V-DM}$=1+R3/R1<2, such that where R1=R2 and R3=R4, R1>R3.

For such a small differential gain, the magnitude of the correction voltage $V_4$ applied to the node V4 in FIG. 6 (to cause $V_{OUT-CM} \approx V_{CM}$) is greater than the resultant shift in $V_{OUT-CM}$. In some applications, this may result in an unacceptable loss of voltage head room. This loss of head room may be reduced or eliminated by replacing the single-output transconductance amplifier 86 (FIG. 6) with the dual-output transconductance amplifier 112.

In the amplifier circuit 110, the current $I_{OUT}$, which the transconductance amplifier 86 applied to the node V4 in the amplifier circuit 80 (FIG. 6), is now split, ideally, into two equal currents $I_{OUT1}$ and $I_{OUT2}$, which the dual-output transconductance amplifier 112 respectively applies to the nodes V1 and V2 so that $V_4=V_{IN-CM}$ and little or no shift of the voltage $V_4$ at the node V4 is made or required.

The current $I_{OUT1}$ that the dual-output transconductance amplifier 112 sinks from the node V1 is given by the following equation:

$$I_{OUT1}=g_{m1}\cdot(V_3-V_{CM}) \tag{19}$$

Similarly, the current $I_{OUT2}$ that the dual-output transconductance amplifier 112 sinks from the node $V_2$ is given by the following equation:

$$I_{OUT2}=g_{m2}\cdot(V_3-V_{CM}) \tag{20}$$

Ideally, $g_{m1}=g_{m2}$, but, in actuality, the transconductance gains $g_{m1}$ and $g_{m2}$ can have slightly different values.

This inequality between $g_{m1}$ and $g_{m2}$ typically does not affect the common-mode gain $A_{V-CM}$ of the amplifier circuit 110, because $A_{V-CM}$ is a function of the average transconductance $(g_{m1}+g_{m2})/2$ of the dual-output transconductance amplifier 112.

But this inequality can introduce common-mode distortion to the differential output of the amplifier circuit 110 by causing the conversion of the input common-mode voltage $V_{IN-CM}$ into a small component of the differential-mode output voltage $V_{OUT-DM}$; for example, the component of $V_{OUT-DM}$ due to $V_{IN-CM}$ can be approximately 1% of the magnitude of $V_{OUT-DM}$, and is proportional to the difference $g_{m1}-g_{m2}$. The same result ($V_{IN-CM}$ being converted to a component of $V_{OUT-DM}$) also can occur if R1 R2 or R3 R4. But because resistor-value matching is typically better than transconductance matching of $g_{m1}$ and $g_{m2}$, the component of $V_{OUT-DM}$ due to $V_{IN-CM}$ because of a resistor mismatch is typically less than approximately 0.1% of the magnitude of $V_{OUT-DM}$ for the amplifier circuit 80 and for the amplifier circuit 110.

Therefore, even though the dual-output transconductance amplifier 112 can introduce common-mode distortion into the output differential voltage $V_{OUT-DM}$ due to a mismatch between $g_{m1}$ and $g_{m2}$, the level of such common-mode distortion is typically small enough for the benefit of replacing the single-output transconductance amplifier 86 (FIG. 6) with the dual-output transconductance amplifier (to maintain $V_4 \approx V_{IN-COM}$) to outweigh any potential disadvantage caused by the introduction of such common-mode distortion.

Still referring to FIG. 7, alternate embodiments of the amplifier circuit 110 are contemplated. For example, any alternate embodiment described above for the amplifier circuit 80 of FIG. 6 may be applicable to the amplifier circuit 110.

Figure 8:
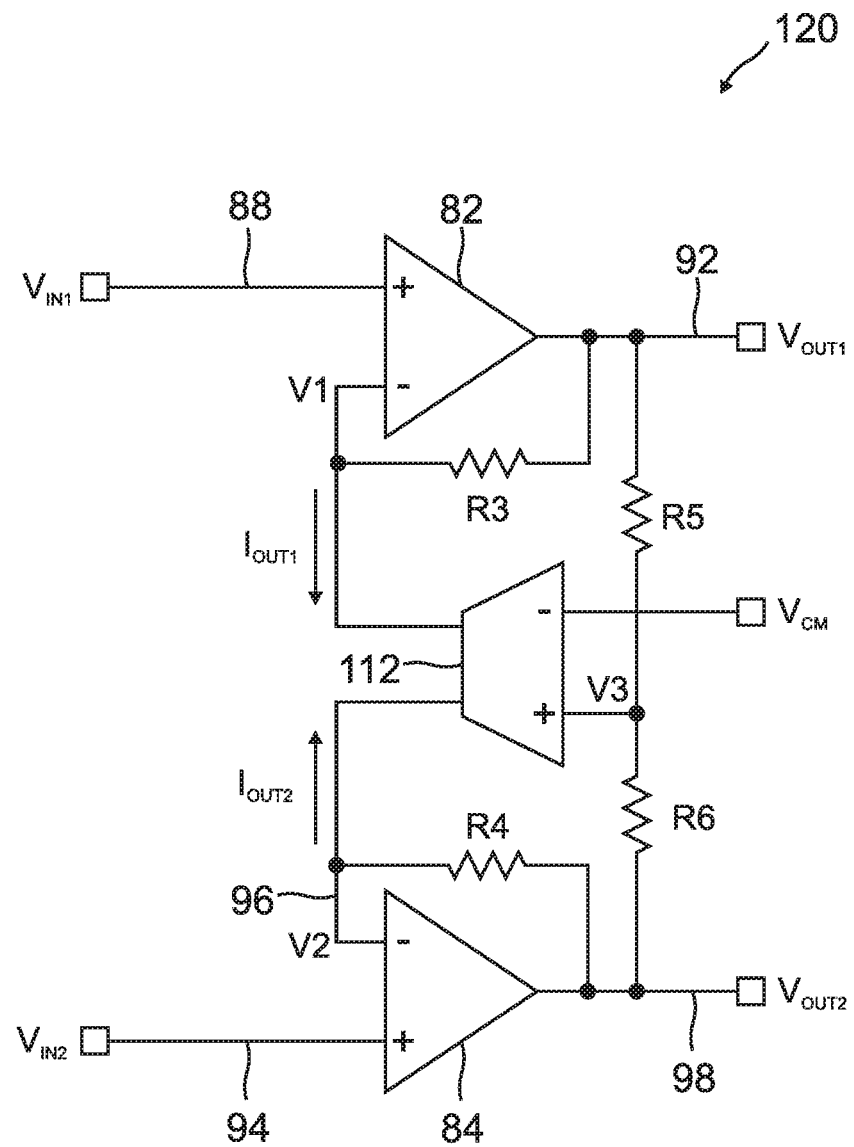
FIG. 8 is a schematic diagram of a non-inverting fully differential amplifier circuit with an approximately zero common-mode gain and with a settable common-mode output voltage that is approximately independent from the common-mode input voltage, according to yet another embodiment.

FIG. 8 is a schematic diagram of a non-inverting fully differential amplifier circuit 120, according to an embodiment.

The amplifier circuit 120 is similar to the amplifier circuit 110 of FIG. 7 except that the resistors R1 and R2 are omitted to impart to the amplifier circuit 120 a gain of approximately unity. Therefore, like numbers reference components common to the amplifier circuits 110 and 120 in FIGS. 7 and 8.

Because the resistors R3 and R4 do not affect the differential gain (e.g., R3 and R4 can be replaced with short circuits such that, effectively, R3=R4=0), these resistors, if included, can be unmatched relative to one another.

Therefore, the resistors R3 and R4 can be included, and intentionally mismatched, to compensate for any mismatch between $g_{m1}$ and $g_{m2}$ of the dual-output transconductance amplifier 112.

That is, the values of R3 and R4 can be selected to reduce the magnitude of, or to eliminate, the distortion component of the output differential voltage $V_{OUT-DM}$ caused by the mismatch between $g_{m1}$ and $g_{m2}$ effectively converting the input common-mode voltage $V_{IN-COM}$ into a small differential output-distortion voltage. To eliminate the conversion of common-mode signals to differential signals, a designer selects the values of the resistors R3 and R4 such that the voltages across the resistors R3 and R4 are, at least ideally, equal. In other words, $I_{OUT1} \cdot R3 = I_{OUT2} \cdot R4$. For example, if $I_{OUT1} = 0.99 \cdot I_{OUT2}$ due to the fact that $g_{m1} = 0.99 \cdot g_{m2}$, then making $R4 = 0.99 \cdot R3$ ensures that both resistor voltage drops will be the same ($0.99 \cdot I_{OUT2} \cdot R3 = I_{OUT2} \cdot 0.99 \cdot R3$) such that the amplifier circuit 120 ideally generates no distortion component of the output differential voltage $V_{OUT-DM}$ caused by the mismatch between $g_{m1}$ and $g_{m2}$.

Still referring to FIG. 8, alternate embodiments of the amplifier circuit 120 are contemplated. For example, any alternate embodiment described above for the amplifier circuit 80 of FIG. 6 or the amplifier circuit 110 of FIG. 7 may be applicable to the amplifier circuit 120.

Figure 9:
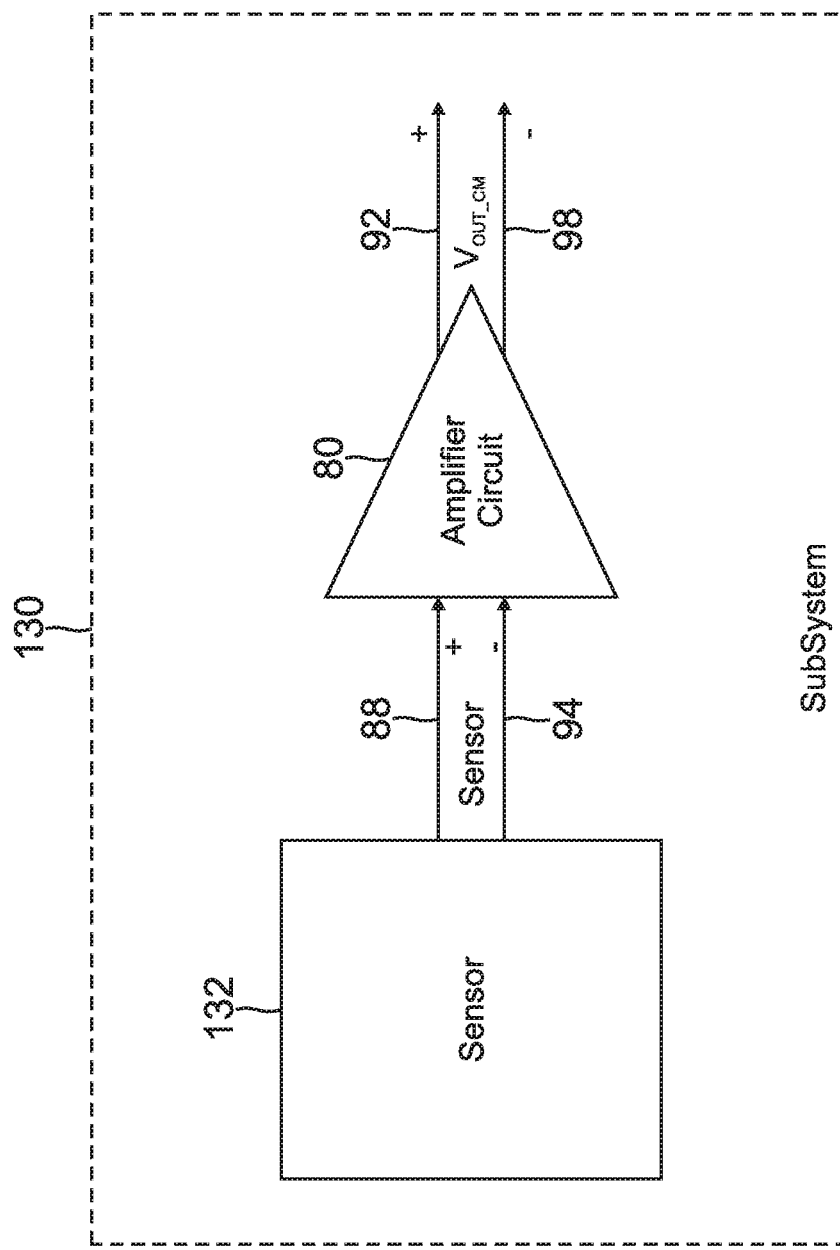
FIG. 9 is a diagram of a subsystem that includes one or more of the amplifier circuits of FIGS. 6-8, according to an embodiment.

FIG. 9 is a diagram of a subsystem 130, which includes one or more of the amplifier circuits 80, 110, and 120 of FIGS. 6-8, respectively, according to an embodiment. For example, purposes, the subsystem 130 is described as including one amplifier circuit 80, it being understood that the system can include one or more of the amplifier circuits 110 and 120 instead of, or in addition to, one or more of the amplifier circuit 80. Examples of the subsystem 130 include an inertial navigation subsystem (including MEMS accelerometers and/or MEMS gyroscopes), a global-positioning-system (GPS) subsystem, a motion-detection subsystem, a radar subsystem, a sonar subsystem, an instrumentation subsystem, and a communication subsystem.

In addition to the amplifier circuit 80, the system 130 includes a sensor 132, which generates a differential voltage signal SENSOR and which provides the differential signal SENSOR across the differential input nodes 88 and 94 of the amplifier circuit 80. And the amplifier circuit 80 amplifies the signal SENSOR to generate a differential output voltage signal $V_{OUT\_DM}$ across the output nodes 92 and 98. Examples of the sensor include an accelerometer, a temperature sensor, a light sensor, a humidity sensor, and a gyroscope (e.g., a MEMS gyroscope).

The sensor 132 and the amplifier circuit 80 can be disposed on a same integrated circuit die, and within a same integrated-circuit package. Or the sensor 132 and amplifier circuit 80 can be disposed separate from one another.

Still referring to FIG. 9, alternate embodiments of the subsystem 130 are contemplated. For example, although only one sensor 132 is described, the subsystem 130 can include more than one sensor 132, and, therefore, can include more than one amplifier circuit 80. Furthermore, although one sensor 132 is described as feeding one amplifier circuit 80, multiple sensors can feed a single amplifier circuit, and a single sensor can feed multiple amplifier circuits. Moreover, although not described, the sensor 132 can receive a single-ended or differential input signal, such as a clock signal. In addition, the subsystem 130 can include components in addition to the sensor 132 and amplifier circuit 80, and can include a device other than a sensor feeding the amplifier circuit.

Figure 10:
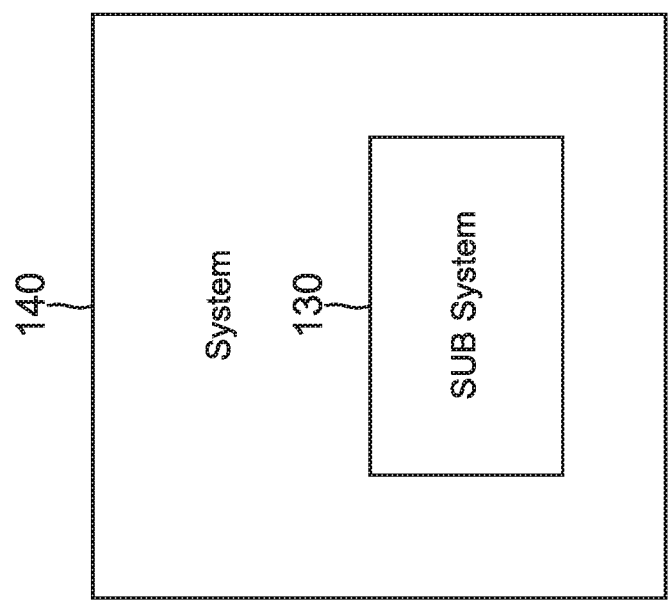
FIG. 10 is a diagram of a system that includes one or more of the subsystems of FIG. 9, according to an embodiment.

FIG. 10 is a diagram of a system 140, which includes one or more of the subsystems 130 of FIG. 9, according to an embodiment. Examples of the system 140 include a vehicle (e.g., drone, automobile, space craft, aircraft, train, bus, or water ship or vessel), a computer, a laptop, a tablet, and a smart phone.

Still referring to FIG. 10, alternate embodiments of the system 140 are contemplated. For example, although only one subsystem 130 is described, the system 140 can include more than one subsystem 130, and the multiple subsystems can be of the same, or of different, types.

From the foregoing it will be appreciated that, although specific embodiments have been described herein for purposes of illustration, various modifications may be made without deviating from the spirit and scope of the disclosure. Furthermore, where an alternative is disclosed for a particular embodiment, this alternative may also apply to other embodiments even if not specifically stated. Moreover, the components described above may be disposed on a single or multiple integrated-circuit (IC) or integrated-photonic (IP) dies to form one or more ICs/IPs, these one or more ICs/IPs may be coupled to one or more other ICs/IPs. Furthermore, one or more components of a described apparatus or system may have been omitted from the description for clarity or another reason. Moreover, one or more components of a described apparatus or system that have been included in the description may be omitted from the apparatus or system.

Example Embodiments

Example 1 includes an amplifier circuit, comprising: a first amplifier having a noninverting input node configured to receive a first component of a differential input signal, having an inverting input node, and having an output node configured to provide a first component of a differential output signal; a second amplifier having a noninverting input node configured to receive a second component of the differential input signal, having an inverting input node, and an output node configured to provide a second component of the differential output signal; and a transconductance amplifier having an inverting input node configured to receive a reference signal, having a noninverting input node coupled to the output nodes of the first and second amplifiers, and having a first output node coupled to the inverting input node of at least one of the first amplifier and the second amplifier.

Example 2 includes the amplifier circuit of Example 1 wherein the transconductance amplifier is configured to cause the first amplifier and the second amplifier to generate the first component and the second component, respectively, of the differential output signal about an output common-mode signal that is related to the reference signal.

Example 3 includes the amplifier circuit of any of Examples 1-2 wherein the transconductance amplifier is configured to cause the first amplifier and the second amplifier to generate the first component and the second component, respectively, of the differential output signal about an output common-mode signal that is approximately equal to the reference signal.

Example 4 includes the amplifier circuit of any of Examples 1-3 wherein: the differential output signal includes a differential output voltage; the reference signal includes a reference voltage; and the transconductance amplifier is configured to cause the first amplifier and the second amplifier to generate the first component and the second component, respectively, of the differential output voltage about an output common-mode voltage that is approximately equal to the reference voltage.

Example 5 includes the amplifier circuit of and of Examples 1-4, wherein: the first output node of the transconductance amplifier is coupled to the inverting input node of one of the first amplifier and the second amplifier; and the transconductance amplifier has a second output node coupled to the inverting input node of the other of the first amplifier and the second amplifier.

Example 6 includes the amplifier circuit of any of Examples 1-5, further comprising: a first feedback network coupled to the inverting input node and the output mode of the first amplifier; and a second feedback network coupled to the inverting input node and the output node of the second amplifier.

Example 7 includes the amplifier circuit of any of Examples 1-6, further comprising: a first bias network coupled to the output node of the first amplifier and the noninverting input node of the transconductance amplifier; and a second bias network coupled to the output node of the second amplifier and the noninverting input node of the transconductance amplifier.

Example 8 includes the amplifier circuit of any of Examples 1-7, further comprising: a first feedback network coupled to the inverting input node of the first amplifier and the output node of the transconductance amplifier; and a second feedback network coupled to the inverting input node of the second amplifier and the output node of the transconductance amplifier.

Example 9 includes the amplifier circuit of any of Examples 5-8, further comprising: a first feedback network coupled to the inverting input node of the first amplifier and the first output node of the transconductance amplifier; and a second feedback network coupled to the inverting input node of the second amplifier and the second output node of the transconductance amplifier.

Example 10 includes the amplifier circuit of any of Examples 1-9 wherein: the first amplifier includes a first operational amplifier; and the second amplifier includes a second operational amplifier.

Example 11 includes the amplifier circuit of any of Examples 1-10 wherein: the first amplifier includes a first transconductance amplifier; and the second amplifier includes a second transconductance amplifier.

Example 12 includes the amplifier circuit of any of Examples 1-11 wherein: the noninverting node of the first amplifier is configured to receive a common-mode signal; the noninverting node of the second amplifier is configured to receive the common-mode signal; and the transconductance amplifier is configured to cause the first and second amplifiers to amplify the common-mode signal with a gain that is less than unity.

Example 13 includes an amplifier circuit, comprising: first and second amplifiers configured to receive a differential input signal, and to multiply the differential input signal by a differential gain that is greater than zero; and a third amplifier configured to receive a reference signal, and to cause the first and second amplifiers to generate a common-mode output signal that is related to the reference signal.

Example 14 includes the amplifier circuit of Examples 13 wherein the third amplifier includes a transconductance amplifier.

Example 15 includes a method, comprising: generating a differential output signal by amplifying a differential input signal with a non-inverting gain; and generating a common-mode output signal by amplifying a common-mode input signal with a gain having a magnitude that is less than unity.

Example 16 includes the method of Example 15 wherein: generating the differential output signal includes amplifying a first component of the differential input signal with a first amplifier, and amplifying a second component of the differential input signal a second amplifier; and causing the first and second amplifiers to generate the common-mode output signal approximately equal to a reference signal.

Example 17 includes the method of any of Examples 15-16 wherein: generating the differential output signal includes amplifying a first component of the differential input signal with a first amplifier, and amplifying a second component of the differential input signal a second amplifier; and causing the first and second amplifiers to generate the common-mode output signal approximately equal to a reference signal by generating, in response to the common-mode output signal and the reference signal, a feedback signal, and coupling the feedback signal to a input node of the first amplifier and to an input node of the second amplifier.

Example 18 includes the method of any of Examples 15-17 wherein: generating the differential output signal includes amplifying a first component of the differential input signal with a first amplifier, and amplifying a second component of the differential input signal a second amplifier; and causing the first and second amplifiers to generate the common-mode output signal approximately equal to a reference signal by generating, in response to the common-mode output signal and the reference signal, first and second feedback signals, coupling the first feedback signal to an input node of the first amplifier, and coupling the second feedback signal to an input node of the second amplifier.

Example 19 includes a subsystem, comprising: a sensor configured to generate a differential sensor signal; and an amplifier circuit, including a first amplifier having a noninverting input node configured to receive a first component of the differential sensor signal, having an inverting input node, and having an output node configured to provide a first component of a differential amplified sensor signal; a second amplifier having a noninverting input node configured to receive a second component of the differential sensor signal, having an inverting input node, and an output node configured to provide a second component of the differential amplified sensor signal; and a transconductance amplifier having an inverting input node configured to receive a reference signal, having a noninverting input node coupled to the output nodes of the first and second amplifiers, and having a first output node coupled to the inverting input node of at least one of the first amplifier and the second amplifier.

Example 20 includes the subsystem of Example 19, further comprising: an integrated circuit; and wherein the sensor and the amplifier circuit are disposed on the integrated circuit.

Example 21 includes a system, comprising: a subsystem, including a sensor configured to generate a differential sensor signal; and an amplifier circuit, including a first amplifier having a noninverting input node configured to receive a first component of the differential sensor signal, having an inverting input node, and having an output node configured to provide a first component of a differential amplified sensor signal; a second amplifier having a noninverting input node configured to receive a second component of the differential sensor signal, having an inverting input node, and an output node configured to provide a second component of the differential amplified sensor signal; and a transconductance amplifier having an inverting input node configured to receive a reference signal, having a noninverting input node coupled to the output nodes of the first and second amplifiers, and having a first output node coupled to the inverting input node of at least one of the first amplifier and the second amplifier.

Example 22 includes the system of Example 21 wherein the subsystem includes a navigation subsystem.

Example 23 includes the system of any of Examples 21-22 wherein the subsystem includes a communication subsystem.

Although specific embodiments have been illustrated and described herein, it will be appreciated by those of ordinary skill in the art that any arrangement, which is calculated to achieve the same purpose, may be substituted for the specific embodiments shown. Therefore, it is manifestly intended that this invention be limited only by the claims and the equivalents thereof.

What is claimed is:

1. An amplifier circuit, comprising:
a first amplifier having a noninverting input node configured to receive a first component of a differential input signal, having an inverting input node, and having an output node configured to provide a first component of a differential output signal;
a second amplifier having a noninverting input node configured to receive a second component of the differential input signal, having an inverting input node, and an output node configured to provide a second component of the differential output signal; and
a transconductance amplifier having an inverting input node configured to receive a reference signal, having a noninverting input node coupled to the output nodes of the first and second amplifiers, and having a first output node coupled to the inverting input node of at least one of the first amplifier and the second amplifier.

2. The amplifier circuit of claim 1 wherein the transconductance amplifier is configured to cause the first amplifier and the second amplifier to generate the first component and the second component, respectively, of the differential output signal about an output common-mode signal that is related to the reference signal.

3. The amplifier circuit of claim 1 wherein the transconductance amplifier is configured to cause the first amplifier and the second amplifier to generate the first component and the second component, respectively, of the differential output signal about an output common-mode signal that is approximately equal to the reference signal.

4. The amplifier circuit of claim 1 wherein:
the differential output signal includes a differential output voltage;
the reference signal includes a reference voltage; and
the transconductance amplifier is configured to cause the first amplifier and the second amplifier to generate the first component and the second component, respectively, of the differential output voltage about an output common-mode voltage that is approximately equal to the reference voltage.

5. The amplifier circuit of claim 1, wherein:
the first output node of the transconductance amplifier is coupled to the inverting input node of one of the first amplifier and the second amplifier; and
the transconductance amplifier has a second output node coupled to the inverting input node of the other of the first amplifier and the second amplifier.

6. The amplifier circuit of claim 1, further comprising:
a first feedback network coupled to the inverting input node and the output mode of the first amplifier; and
a second feedback network coupled to the inverting input node and the output node of the second amplifier.

7. The amplifier circuit of claim 1, further comprising:
a first bias network coupled to the output node of the first amplifier and the noninverting input node of the transconductance amplifier; and
a second bias network coupled to the output node of the second amplifier and the noninverting input node of the transconductance amplifier.

8. The amplifier circuit of claim 1, further comprising:
a first feedback network coupled to the inverting input node of the first amplifier and the output node of the transconductance amplifier; and
a second feedback network coupled to the inverting input node of the second amplifier and the output node of the transconductance amplifier.

9. The amplifier circuit of claim 5, further comprising:
a first feedback network coupled to the inverting input node of the first amplifier and the first output node of the transconductance amplifier; and
a second feedback network coupled to the inverting input node of the second amplifier and the second output node of the transconductance amplifier.

10. The amplifier circuit of claim 1 wherein:
the first amplifier includes a first operational amplifier; and
the second amplifier includes a second operational amplifier.

11. The amplifier circuit of claim 1 wherein:
the first amplifier includes a first transconductance amplifier; and
the second amplifier includes a second transconductance amplifier.

12. The amplifier circuit of claim 1 wherein:
the noninverting node of the first amplifier is configured to receive a common-mode signal;
the noninverting node of the second amplifier is configured to receive the common-mode signal; and
the transconductance amplifier is configured to cause the first and second amplifiers to amplify the common-mode signal with a gain that is less than unity.

13. An amplifier circuit, comprising:
first and second amplifiers configured
to receive a differential input signal, and
to multiply the differential input signal by a differential gain that is greater than zero; and
a third amplifier configured
to receive a reference signal, and
to cause the first and second amplifiers to generate a common-mode output signal that is related to the reference signal.

14. The amplifier circuit of claim 13 wherein the third amplifier includes a transconductance amplifier.

15. A method, comprising:
generating a differential output signal by amplifying a differential input signal with a non-inverting gain;
loading a common-mode reference signal with an impedance no less than an input impedance of an amplifier; and
generating a common-mode output signal by amplifying the common-mode reference signal with a gain having a magnitude that is less than unity.

16. The method of claim 15 wherein:
generating the differential output signal includes
amplifying a first component of the differential input signal with a first amplifier, and
amplifying a second component of the differential input signal a second amplifier; and
causing the first and second amplifiers to generate the common-mode output signal approximately equal to the reference signal.

17. The method of claim 15 wherein:
generating the differential output signal includes
amplifying a first component of the differential input signal with a first amplifier, and
amplifying a second component of the differential input signal a second amplifier; and
causing the first and second amplifiers to generate the common-mode output signal approximately equal to the reference signal by
generating, in response to the common-mode output signal and the reference signal, a feedback signal, and coupling the feedback signal to an input node of the first amplifier and to an input node of the second amplifier.

18. The method of claim 15 wherein:
generating the differential output signal includes
   amplifying a first component of the differential input signal with a first amplifier, and
   amplifying a second component of the differential input signal a second amplifier; and
causing the first and second amplifiers to generate the common-mode output signal approximately equal to the reference signal by
   generating, in response to the common-mode output signal and the reference signal, first and second feedback signals,
   coupling the first feedback signal to an input node of the first amplifier, and
   coupling the second feedback signal to an input node of the second amplifier.

19. A subsystem, comprising:
a sensor configured to generate a differential sensor signal; and
an amplifier circuit, including
   a first amplifier having a noninverting input node configured to receive a first component of the differential sensor signal, having an inverting input node, and having an output node configured to provide a first component of a differential amplified sensor signal;
   a second amplifier having a noninverting input node configured to receive a second component of the differential sensor signal, having an inverting input node, and an output node configured to provide a second component of the differential amplified sensor signal; and
   a transconductance amplifier having an inverting input node configured to receive a reference signal, having a noninverting input node coupled to the output nodes of the first and second amplifiers, and having a first output node coupled to the inverting input node of at least one of the first amplifier and the second amplifier.

20. The subsystem of claim 19, further comprising:
an integrated circuit; and
wherein the sensor and the amplifier circuit are disposed on the integrated circuit.

21. A system, comprising:
a subsystem, including
   a sensor configured to generate a differential sensor signal; and
   an amplifier circuit, including
      a first amplifier having a noninverting input node configured to receive a first component of the differential sensor signal, having an inverting input node, and having an output node configured to provide a first component of a differential amplified sensor signal;
      a second amplifier having a noninverting input node configured to receive a second component of the differential sensor signal, having an inverting input node, and an output node configured to provide a second component of the differential amplified sensor signal; and
      a transconductance amplifier having an inverting input node configured to receive a reference signal, having a noninverting input node coupled to the output nodes of the first and second amplifiers, and having a first output node coupled to the inverting input node of at least one of the first amplifier and the second amplifier.

22. The system of claim 21 wherein the subsystem includes a navigation sub system.

23. The system of claim 21 wherein the subsystem includes an instrumentation subsystem.

* * * * *